(12) United States Patent  
Kimura et al.

(10) Patent No.: US 7,497,365 B2
(45) Date of Patent: Mar. 3, 2009

(54) PASTE COATER AND POP AUTOMATIC MOUNTING APPARATUS EMPLOYING THE SAME

(75) Inventors: Hideo Kimura, Shiga (JP); Toshiyuki Yokoue, Shiga-ken (JP); Yasuhiko Shiota, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 11/608,897

(22) Filed: Dec. 11, 2006

(65) Prior Publication Data

US 2007/0137559 A1 Jun. 21, 2007

(30) Foreign Application Priority Data

Dec. 16, 2005 (JP) ............................. 2005-363827

(51) Int. Cl.
  *B05C 1/08* (2006.01)
  *B05C 1/06* (2006.01)
(52) U.S. Cl. ............................. 228/38; 228/35; 228/39; 228/45; 118/207; 118/258; 118/222; 118/244; 118/256
(58) Field of Classification Search .................. 228/35, 228/39, 45, 4.1, 6.1, 5.1, 38, 40; 118/207, 118/213, 222, 244, 256
See application file for complete search history.

(56) References Cited

U.S. PATENT DOCUMENTS 4,588,470 A * 5/1986 Abegglen .................... 156/578
6,423,374 B1 * 7/2002 Laursen ...................... 427/284
6,827,783 B2 * 12/2004 Okeshi et al. ............... 118/679
2003/0121470 A1 * 7/2003 Okeshi et al. ............... 118/244

FOREIGN PATENT DOCUMENTS

| JP | 63-273400 | 11/1988 |
|---|---|---|
| JP | 05-131610 | 5/1993 |
| JP | 10-041339 | 2/1998 |
| JP | 10277454 | 10/1998 |
| JP | 11224482 | 8/1999 |
| JP | 2000-022394 | 1/2000 |
| JP | 2000-195897 | 7/2000 |
| JP | 2000-228575 | 8/2000 |
| JP | 2002-185117 | 6/2002 |
| JP | 2002-334891 | 11/2002 |
| JP | 2003211055 A | 7/2003 |
| JP | 2003-320288 | 11/2003 |
| JP | 2005-116917 | 4/2005 |
| JP | 2005217118 A | 8/2005 |

* cited by examiner

*Primary Examiner*—Kiley Stoner
*Assistant Examiner*—Erin P Barry
(74) *Attorney, Agent, or Firm*—Matthew C. Zehrer; Shimokaji & Associates, P.C.

(57) ABSTRACT

A paste coater that can apply an amount of a solder paste to small-diameter bump electrodes at a narrow pitch is described. A paste coater includes: a transfer roller, supported by a sub frame; a roller drive mechanism for rotating the transfer roller; a paste storage unit for storing paste to be supplied to the surface of the transfer roller; a squeegee having a distal edge, parallel to the rotary shaft of the transfer roller, separated by a gap from the distal edge to the surface of the transfer roller; a squeegee holder for holding and including biasing means for pushing the squeegee in a first direction thereby widening the gap; and a gap adjustment mechanism with biasing means for pushing the squeegee in a second direction thereby narrowing the gap.

9 Claims, 7 Drawing Sheets

PASTE COATER AND PoP AUTOMATIC MOUNTING APPARATUS EMPLOYING THE SAME

FIELD OF THE INVENTION

The present invention relates to a paste coater and to a PoP (Package on Package) automatic mounting apparatus that employs the paste coater. More particularly, the present invention relates to a paste coater that applies a solder paste to ball electrodes of a semiconductor package(i.e. ball grid array (BGA)), a chip scale package and flip chip, and a PoP automatic mounting apparatus that mounts one semiconductor package atop another.

BACKGROUND OF THE INVENTION

A semiconductor package, such as a BGA, includes an array of multiple projecting ball electrodes. In order to mount a semiconductor package on the obverse face of a printed wiring board, multiple methods are conventionally utilized such as: a disc squeegee method, a paste screen print method, or a combination of the two. These methods generally apply a solder paste to either the ball electrodes of the semiconductor package or to the wiring pattern of the printed wiring board.

The disc squeegee method is a technique whereby a disc coated with a solder paste is rotated and the solder paste is smoothed using a squeegee. Thereafter the solder paste is applied to ball electrodes by dipping them in the solder paste. However, with this method, it is difficult to adjust or maintain the rotatory flatness of the rotary disc, and since the rotatory flatness varies each time the disc is detached, uniform volume of the transferred solder paste is not available for all the ball electrodes. This problem is especially seen in warped semiconductor packages, resulting in non uniform ball electrode heights leading to coating discrepancies occurring during the spreading of the solder paste. Another problem occurs when the ball electrodes are dipped to half their height leading to bridges forming between the electrodes.

The paste screen printing method is a technique whereby screen printing is used to apply solder paste to the wiring pattern of a printed wiring board before a semiconductor package is mounted. However, this method is difficult to perform where a wiring pattern has a pitch of 0.3 mm or smaller. Further, since this method does not allow for the coating of too much solder paste, one is unable to absorb the non uniform height of a warped semiconductor package with excess solder paste. In addition, it is difficult to utilize this method with a module where an SMC (Surface Mount Component) is mounted, especially a PoP module that requires the application of a solder paste to a wiring pattern on a component mounting side.

By using a combined method in which both the disc squeegee and the paste screen printing method are used, the amount of solder paste applied can be increased, however a increase in costs can not be avoided.

In accordance with a reduction in the size and thickness of a semiconductor package, the pitch of the ball electrodes is reduced, and the diameter of the ball electrodes becomes minute (i.e. about 0.4 to 0.2 mm). Therefore, the amount of solder paste needed for stable application is decreased.

Further, if a manufacturing variance of ±0.1 mm is present in the heights of ball electrodes, due to the warping of a semiconductor package, a difference of ±0.1 mm will be present between the center and the peripheral portion. Thus, when too little solder paste is applied, some of the ball electrodes will not be coated with solder paste. On the other hand, when too much solder paste is applied, either bridges will occur between the ball electrodes, or the solder paste will touch the obverse face of the board. Therefore, when a conventional method is used to apply solder paste, the soldered ball electrodes must be inspected, either visually or using X-ray.

SUMMARY OF THE INVENTION

One objective of the present invention is to provide a paste coater that can apply a satisfactory amount of a solder paste to small-diameter bump (i.e. ball, stud, etc.) electrodes arranged at small pitches, and a PoP automatic mounting apparatus that employs this paste coater.

According to the present invention, a paste coater that applies solder paste to arrays of bump electrodes, projecting outward from a semiconductor package, comprises: a sub frame, a transfer roller, a roller drive mechanism, a paste storage unit, a squeegee, a squeegee holder and a gap adjustment mechanism. The transfer roller is rotatably and horizontally supported at the sub frame. The roller drive mechanism rotates the transfer roller. The paste storage unit stores paste to be supplied to the surface of the transfer roller. The squeegee has a distal edge parallel to the rotary shaft of the transfer roller, and is located with a gap between the surface of the transfer roller and the distal edge. The squeegee holder supports the squeegee while urging the squeegee in one of either a first direction to extend the gap or a second direction to reduce the gap. The gap adjustment mechanism impels the squeegee in the other direction.

Since the gap adjustment mechanism can precisely adjust the film thickness of the solder paste applied to the transfer roller, the paste coater can apply a satisfactory amount of solder paste on small-diameter bump electrodes arranged at a small pitch.

It is preferable that the paste coater further comprise a slide mechanism and a controller. The slide mechanism moves the sub frame perpendicular to the rotary shaft of the transfer roller. The controller controls the roller drive mechanism and/or the slide mechanism, so that a tangential velocity at the surface of the transfer roller is lower than a movement velocity of the sub frame.

In this case, since the transfer roller forcibly applies solder paste to the bump electrodes with shearing motion between transfer roller and bump electrodes, a large amount of solder paste is applied to the bump electrodes.

According to the present invention, a PoP, automatic mounting apparatus, which mounts a second semiconductor package supplied with bump electrodes on a first semiconductor package, comprises: a first tray, a second tray, a paste coater and package conveying means. A plurality of first semiconductor packages are arranged on the first tray, while a plurality of second semiconductor packages are arranged on the second tray. The paste coater applies solder paste to bump electrodes on the second semiconductor packages. The package conveying means picks up a first semiconductor package from the first tray and conveys it to a predetermined position, picks up a second semiconductor package from the second tray and conveys it to a paste application position, and after the solder paste has been applied by the paste coater, mounts the second semiconductor package on the first at the predetermined position.

Since the PoP automatic mounting apparatus applies solder paste to the bump electrodes of the second semiconductor package and then mounts the second semiconductor package on the first, the two semiconductor packages can be efficiently stacked and packaged.

DETAILED DESCRIPTION OF THE INVENTION

Figure 1:
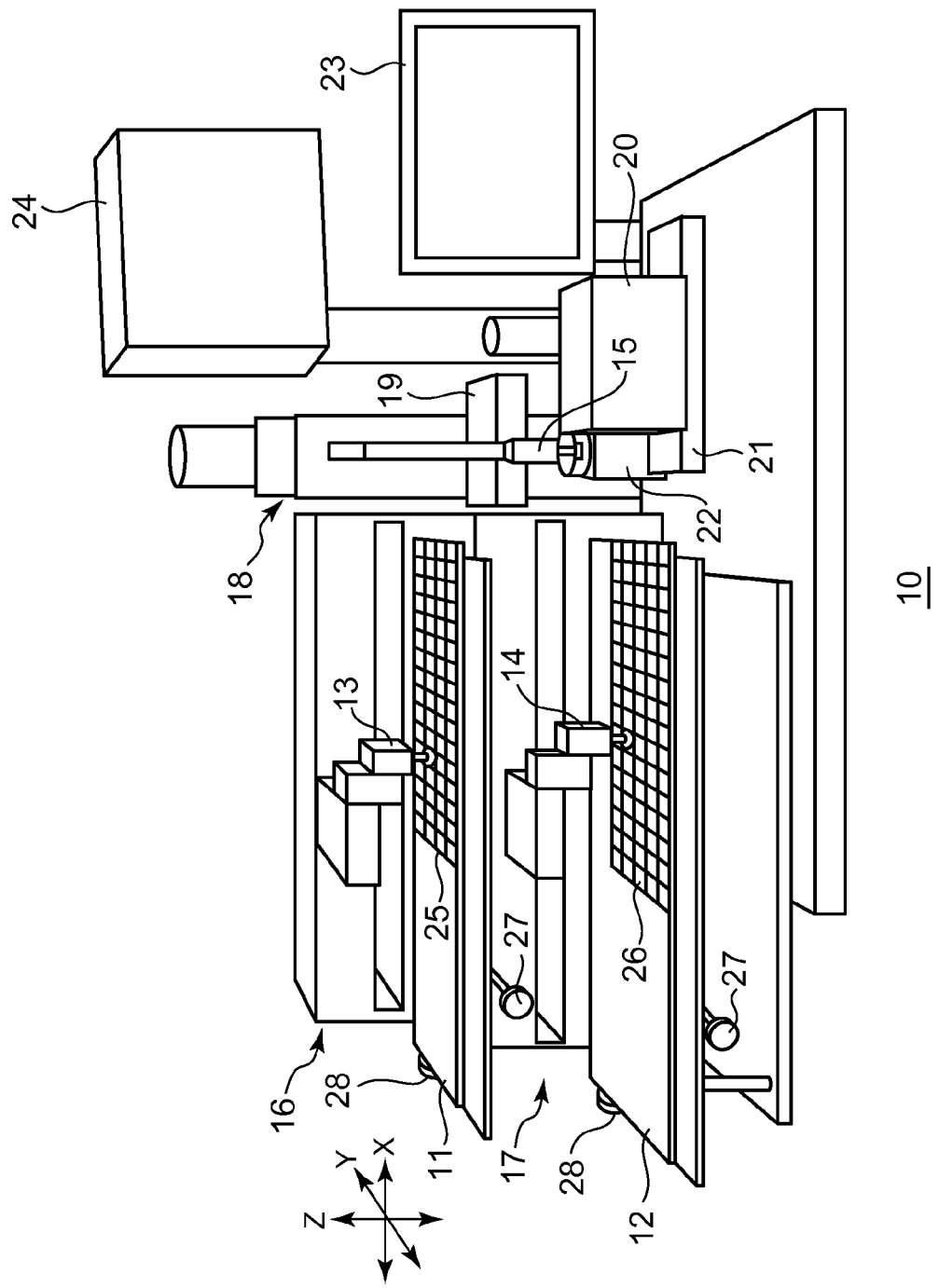
FIG. 1 is a perspective view of the general structure of a PoP automatic mounting apparatus according to one embodiment of the present invention.

The preferred embodiment of the present invention will now be described in detail while referring to the drawings. The same reference numerals are employed to denote identical or corresponding sections, and an explanation for them will not be repeated.

PoP Automatic Mounting Apparatus

While referring to FIG. 1, a PoP automatic mounting apparatus 10 according to this embodiment mounts a semiconductor package (i.e. BGA (ball grid arrary), CSP (chip scale packaging) or a flip chip), atop another semiconductor package, and includes: an upper tray 11, a lower tray 12, suction nozzles 13-15, nozzle convey mechanisms 16-18, a position correction unit 19, a paste coater (including a slide mechanism) 20, an inverting extraction unit 21, a positioning illumination and vertically identical viewing camera optical system 22, an alignment color monitor 23 and a controller 24.

A plurality of upper semiconductor packages 25 are arranged on the upper tray 11, and a plurality of lower semiconductor packages 26 are arranged on the lower tray 12. The suction nozzle 13 picks up one of the semiconductor packages 25 from the upper tray 11 and holds it by applying suction to its upper face. And the suction nozzle 14 picks up one of the semiconductor packages 26 from the lower tray 12 and holds it by applying suction to its upper face.

The nozzle conveying mechanism 16 moves the suction nozzle 13 to the position correction unit 19, and the nozzle conveying mechanism 17 moves the suction nozzle 14 to the inverting extraction unit 21. The nozzle conveying mechanism 18 moves the suction nozzle 15 from the position correction unit 19 to the inverting extraction unit 21.

The position correction unit 19 centers the upper semiconductor package 25. The position correction unit 19 has an inverted trapezoidal shaped pocket, and tapered portions used for positioning are formed in front, at the rear and along the side of the pocket. The front, rear, and side tapered portions are independently movable. The paste coater 20 applies a solder paste to the arrays of ball electrodes on the lower face of the upper semiconductor package 25.

The lower semiconductor package 26 is first placed on the inverting extraction unit 21, and then the upper package semiconductor package 25 is overlaid. The two packages 25 and 26 are positioned on an aluminum plate and are covered with another aluminum plate, and the resultant structure is inverted 180 degrees.

In the operation of the PoP automatic mounting apparatus 10 for stacking two semiconductor packages 25 and 26, the suction nozzle 13 picks up one upper semiconductor package 25 from the upper tray 11, and then, the nozzle conveying mechanism 16 moves the suction nozzle 13 to a location above the position correction unit 19. Since the suction nozzle 13 releases the upper semiconductor package 25 at the location above the position correction unit 19, the upper semiconductor package 25 falls into the pocket of the position correction unit 19, and as a result, the upper semiconductor package 25 is centered at a predetermined location.

Further, when the suction nozzle 14 picks up one lower semiconductor package 26 from the lower tray 12, the nozzle conveying mechanism 17 conveys the suction nozzle 14 to a location above the inverting extraction unit 21. Then, the suction nozzle 14 releases the lower semiconductor package 26 at the location above the inverting extraction unit 21, and positions it at a predetermined location of the inverting extraction unit 21.

Following this, when the suction nozzle 15 picks up the upper semiconductor package 25 from the position correction unit 19 again, the nozzle conveying mechanism 18 conveys the suction nozzle 15 to a location above the paste coater 20.

While the suction nozzle 15 is holding the upper semiconductor package 25 at the predetermined location above the paste coater 20, the paste coater 20 applies a solder paste to the ball electrodes of the upper semiconductor package 25. This process will be described later in detail.

After the coater has applied the solder paste, the suction nozzle 15 moves to a location immediately above the positioning illumination and vertically identical viewing camera optical system 22, and positions the upper semiconductor package 25 relative to the lower semiconductor package 26. Thereafter, the suction nozzle 15 descends, and releases the upper semiconductor package 25 above the inverting extraction unit 21. Thus, the upper semiconductor package 25 is lying on the lower semiconductor package 26, already mounted on the inverting extraction unit 21. And as a result, the upper semiconductor package 25 can be mounted on the lower semiconductor package 26.

The nozzle conveying mechanism 16 returns the suction nozzle 13 from the location above the position correction unit 19 to its original position. Similarly, the nozzle conveying mechanism 17 returns the suction nozzle 14 from the location above the inverting extraction unit 21 to its original position. At this time, the suction nozzles 13 and 14 should be positioned at predetermined locations above the next semiconductor packages 25 and 26 that are to be selected. This positioning method will now be described by using the suction nozzle 13 as an example. It should be noted that the same method is employed for the suction nozzle 14.

Figure 2:
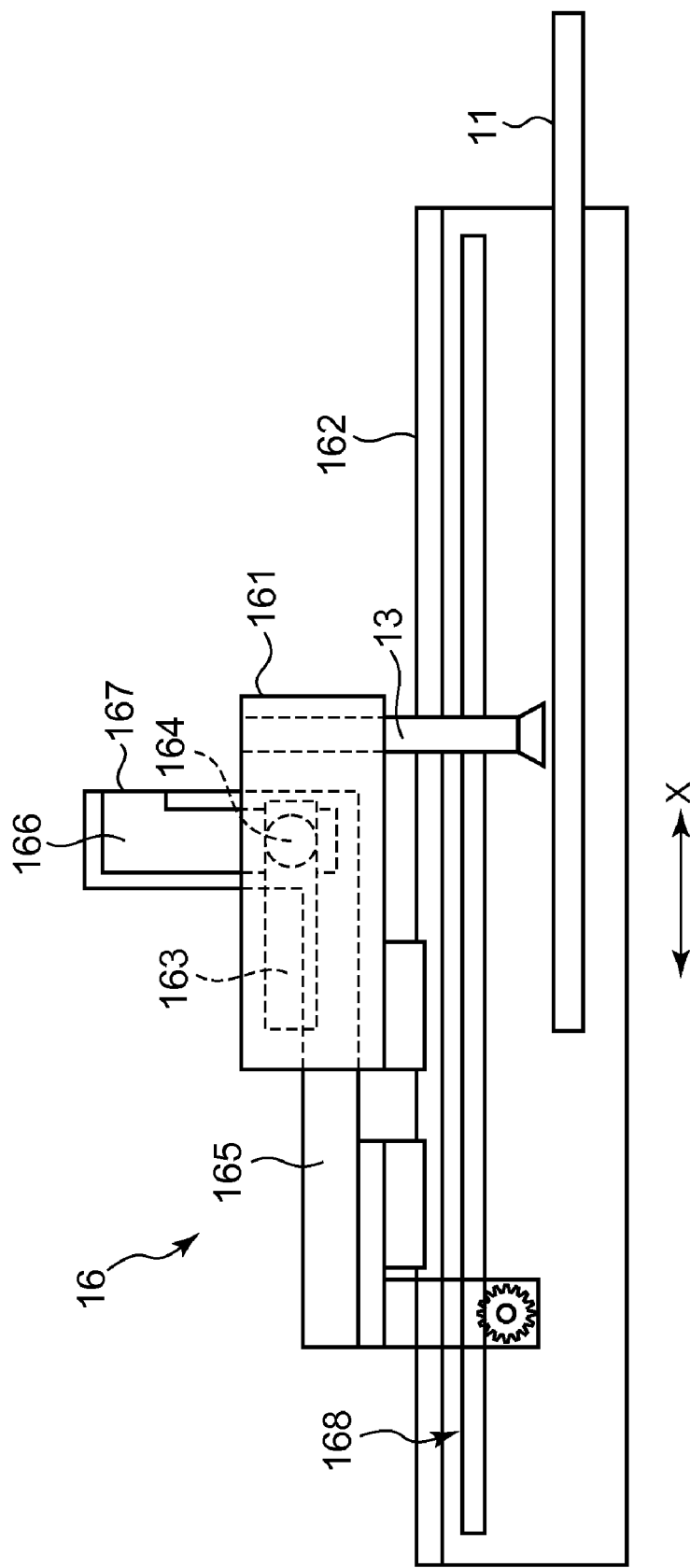
FIG. 2 is a front view of a nozzle conveying mechanism used for the PoP automatic mounting apparatus shown in FIG. 1.

While referring to FIGS. 1 and 2, the suction nozzle 13 is supported by a nozzle conveying unit 161 that moves along a guide rail 162. The nozzle conveying unit 161 rotatably supports a lever 163, which rotatably holds a roller 164 at its distal end. The lever 163 is urged upright, for example, by a spring, when a nozzle positioning unit 165 releases the nozzle conveying unit 161, i.e., the suction nozzle 13 (see FIG. 3(a)).

Figure 3:
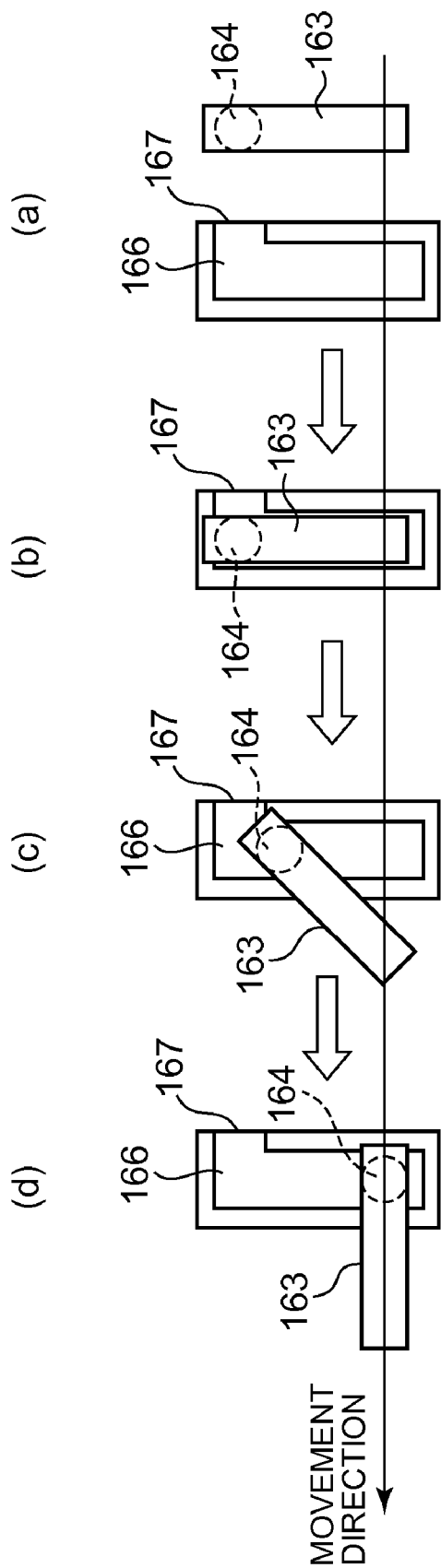
FIGS. 3A to 3D are shifting diagrams showing the operation of the nozzle conveying mechanism in FIG. 2.

The lever 163 is horizontal when the nozzle positioning unit 165 locks the nozzle conveying unit 161 (see FIG. 3(d)).

The nozzle positioning unit 165 includes a guide groove 166 formed to guide a roller 164 for the nozzle conveying unit 161. The guide groove 166 is formed vertically, and has an opening 167, formed in a side wall, for accepting the roller 164. The nozzle positioning unit 165 is manually movable in the X direction by a rack and pinion mechanism 168.

When the nozzle positioning unit 165 has been manually moved and fixed at a desired position, the nozzle conveying unit 161 returns and its roller 164 enters the opening 167 of the nozzle opening unit 165 (see FIG. 3(b)). And while the nozzle conveying unit 161 is sequentially moving, the roller 164 descends along the guide groove 166 and the lever 163 pivots and inclines (see FIG. 3(c)). After the lever 163 has pivoted 90 degrees and becomes horizontal (see FIG. 9D), the nozzle conveying unit 161 is driven against the positioning unit 165 in the direction of movement, and is positioned.

Then, adjustment knobs 27 and 28 are manually turned to move the upper tray 11 in the XY direction, so that the suction nozzle 13 reaches a predetermined position above the next semiconductor package 25 that is to be picked up. When the nozzle positioning unit 165 that currently is holding the nozzle conveying unit 161 is manually moved, the nozzle conveying unit 161 also moves, and the positioning of the suction nozzle 13 can be manually changed.

Though the PoP, automatic mounting apparatus automatically conveys the suction nozzles 13 and 14 to the positions for mounting the semiconductor packages 25 and 26 is automated, the PoP mounting apparatus permits a user to manually convey the suction nozzles 13 and 14 to the positions to pick up the semiconductor packages 25 and 26, the user does not need to enter in advance positions (coordinate data) for picking up the semiconductor packages 25 and 26, or to change a control program for each type of semiconductor package.

[Paste Coater]

While referring to FIG. 4-FIG. 7, the paste coater 20 includes a sub frame 30, a transfer roller 32, a roller drive mechanism 34, a paste storage unit 36, a squeegee 38, a squeegee holder 40 and a gap adjustment mechanism 42.

The transfer roller 32 is horizontally held in the sub frame 30 and is rotatable. In order for the transfer roller 32 to be rotated in a direction indicated by an arrow in FIG. 7, the roller drive mechanism 34 includes: a motor 44 fitted with a gear head; a drive pulley 46 fixed to the drive shaft of the motor 44; a drive pulley 48 fixed to one side of the transfer roller 32; and a power transmission belt 50 extended between the drive pulleys 46 and 48.

An idler pulley 52 is fixed to the other side of the transfer roller 32, and below this, another idler pulley 54 is rotatably held in the sub frame 30 and a power transmission belt 56 is extended between the idler pulleys 52 and 54. The drive pulleys 48 and 46 and the power transmission belt 50 pull and press one end of the rotary shaft of the transfer roller 32 downward perpendicular to the rotary shaft, and the idler pulleys 52 and 54 and the power transmission belt 56 also pull and press the other end of the rotary shaft downward. This process prevents the transfer roller 32 from microscopic wobbling which cause inhomogeneous film thickness of solder.

The paste storage unit 36 stores solder paste to be supplied to the surface of the transfer roller 32. In order to prevent the spreading and leaking of a solder paste, the paste storage unit 36 includes a paste stop guide 58 that is almost U-shaped in plan view and that is secured to the top of the squeegee 38 by bolts. The inner wall of the paste stop guide 58 is tapered toward the transfer roller 32, so that all the solder paste can flow toward the transfer roller 32.

The distal edge of the squeegee 38 is located parallel to the rotary shaft of the transfer roller 32, and separated by a gap from the surface of the transfer roller 32, so as to maintain a constant film thickness for the solder paste attached on the surface of the transfer roller 32.

The squeegee holder 40 includes: a fixed piece 60 secured to the sub frame 30; a movable piece 62 almost L-shaped in cross section; and a bent leaf spring 64 almost U-shaped in cross section. With this arrangement, the squeegee holder 40 pushes the squeegee 38 in a direction (downward) that widens the gap defined between the surface of the transfer roller 32 and the distal edge of the squeegee 38. The paste storage unit 36 and the squeegee 38 are mounted on the distal end of the movable piece 62. One side of the leaf spring 64 is fixed to the fixing piece 60 by a bolt, and the other side is fixed to the movable piece 62 by a bolt. Therefore, the movable piece 62 serves as a cantilever, employing the leaf spring 64 as a fulcrum, and its the distal end is urged downward.

The gap adjustment mechanism 42 includes: an adjustment screw 66 fitted in the sub frame 30; and an elevating member 68, projected upward from the head of the adjustment screw 66. With this arrangement, the gap adjustment mechanism 42 pushes the squeegee 38 in a direction that reduces the gap between the surface of the transfer roller 32 and the distal edge of the squeegee 38. When the adjustment screw 66 is loosened, the elevating member 68 pushes the movable piece 62 up and the gap between the surface of the transfer roller 32 and the distal edge of the squeegee 38 is narrowed. And when the adjustment screw 66 is tightened, the elevating member 68 descends, the movable piece 62 follows due to the biasing force of the leaf spring 64, and the gap between the surface of the transfer roller 32 and the distal edge of the squeegee 38 is widened.

[Slide Mechanism for Paste Coater]

A slide mechanism 29 for the paste coater 20 includes: a fixed base plate 70; two linear guide rails 72 laid on the fixed base plate 70; a moving base plate 74 slidable along the linear guide rails 72; and a base plate drive mechanism 76 that slides the moving base plate 74. The paste coater 20 is mounted on the moving base plate 74.

The base plate drive mechanism 76 includes: a stepping motor 78, mounted on the moving base plate 74 with the paste coater 20; a winding drum 80 fixed to the drive shaft of the stepping motor 78; a traction wire 82 extended above the fixed base plate 70; and an end detection unit (88R, 88L and 90) for detecting the distance the moving base plate 74 has slid and whether if has reached either end.

The traction wire 82 is extended along the linear guide rails 72 and is wound around the winding drum 80 several times in the middle, and is fixed at its ends to a wire extension fitting 86 standing upright on the fixed base plate 70.

Figure 4:
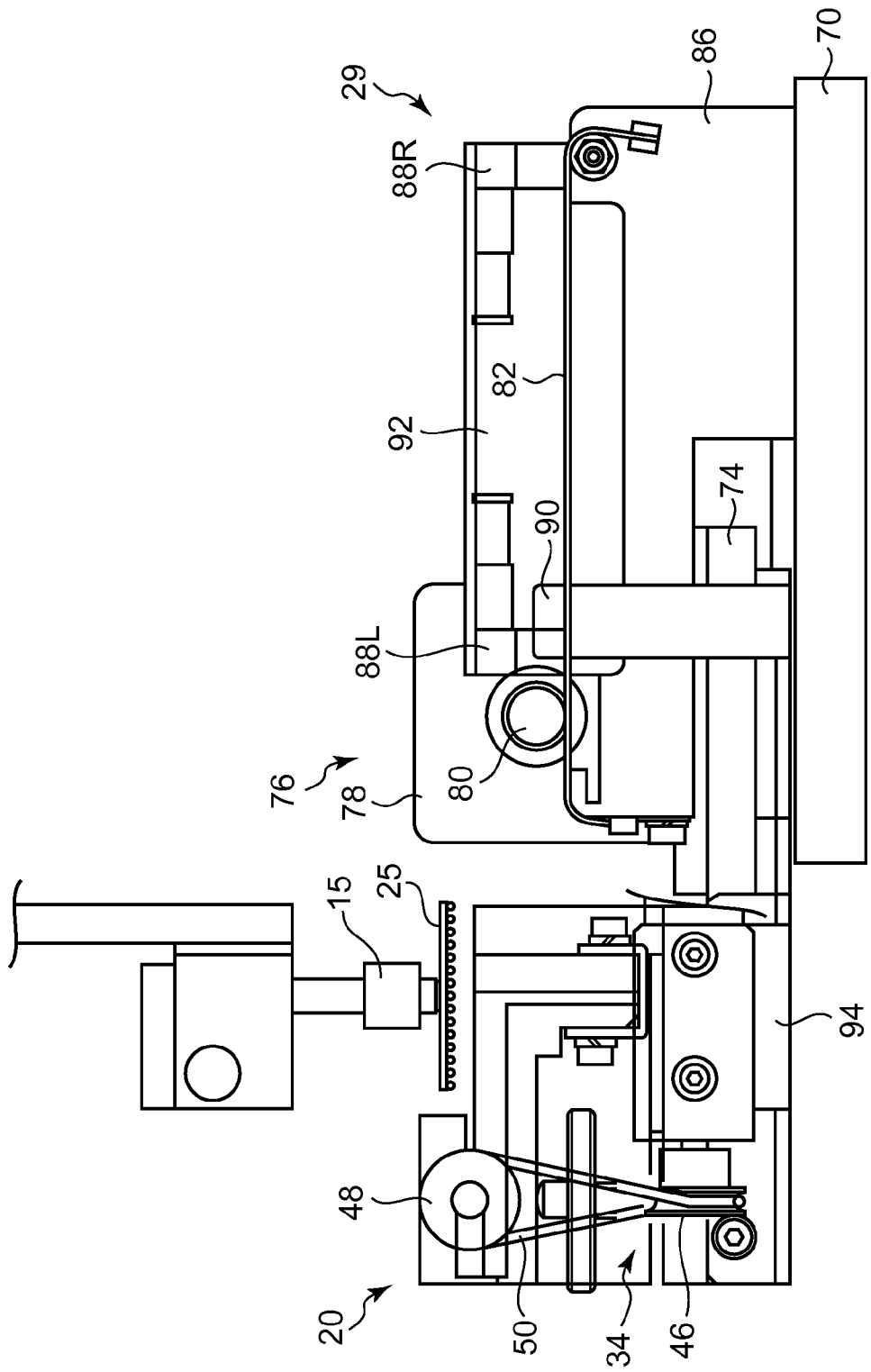
FIG. 4 is a front view of a paste coater and is used for the PoP automatic mounting apparatus in FIG. 1 and a slide mechanism therefor.
Figure 5:
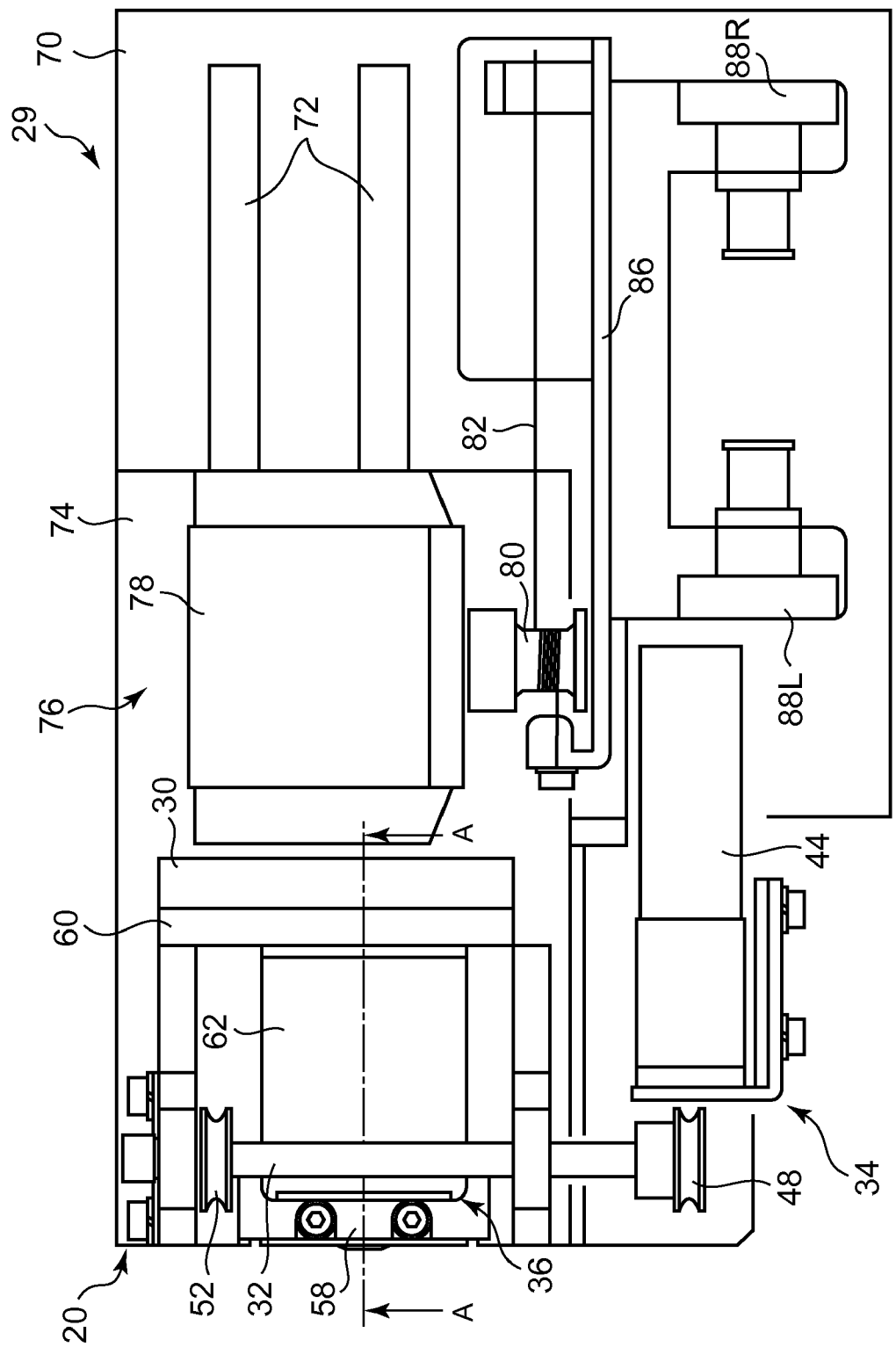
FIG. 5 is a plan view of the paste coater in FIG. 4 and its slide mechanism.
Figure 6:
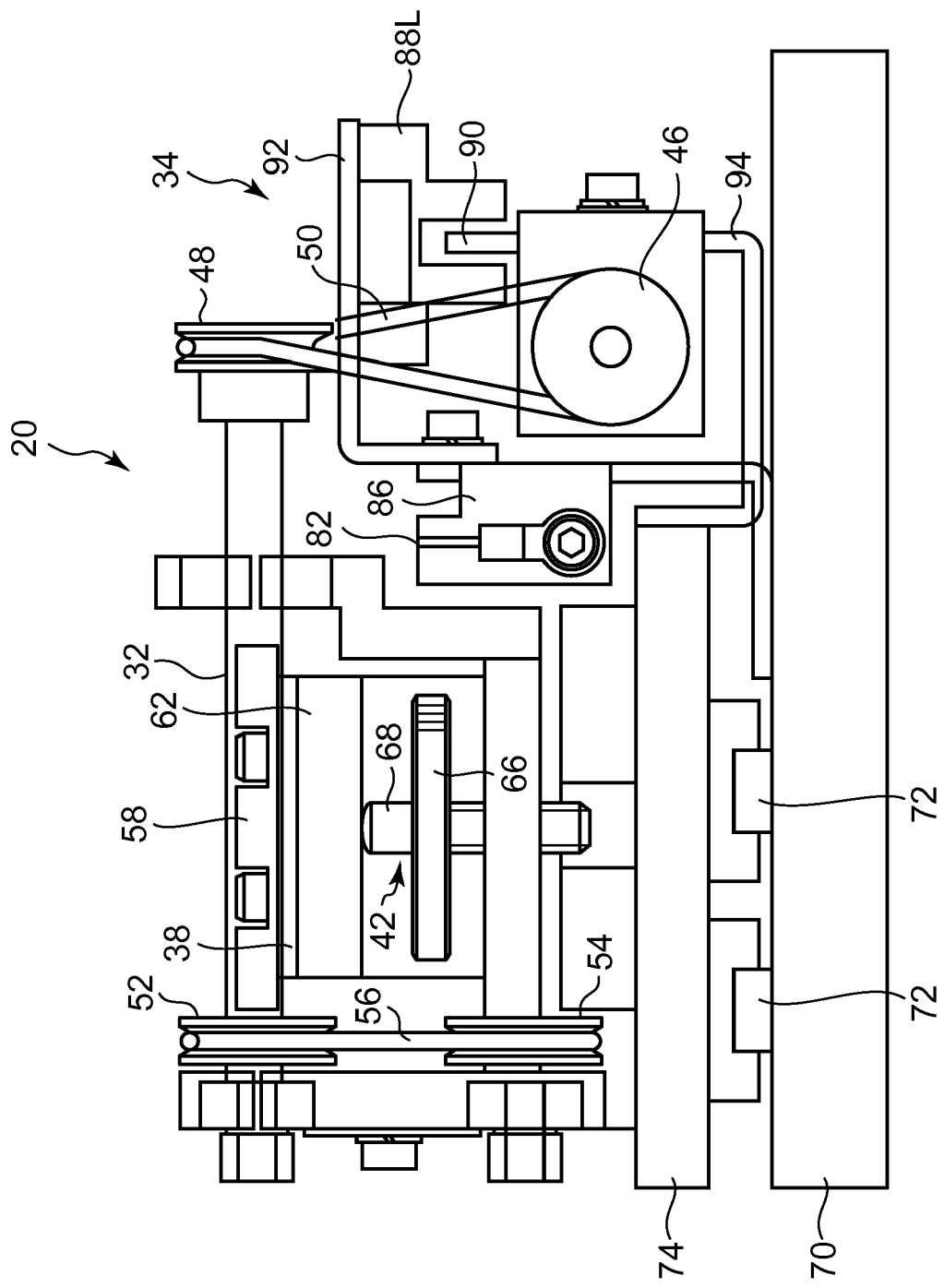
FIG. 6 is a left side view of the paste coater in FIG. 4 and its slide mechanism.
Figure 7:
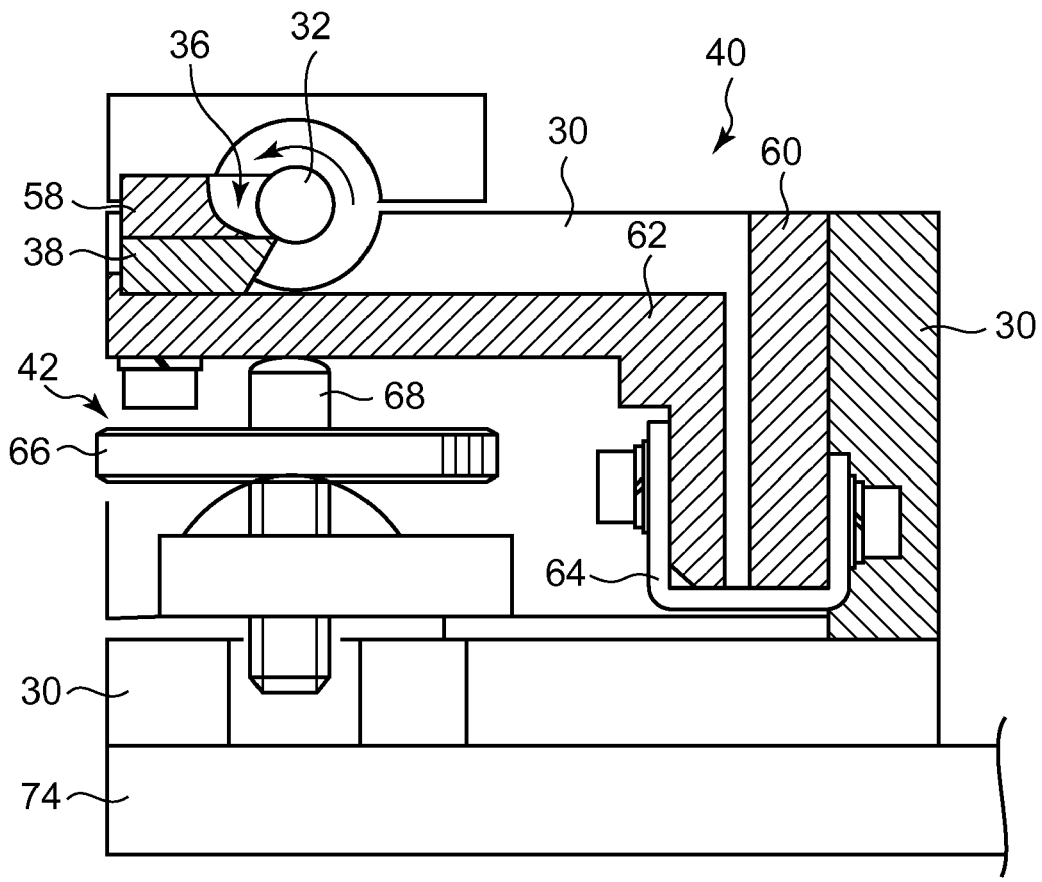
FIG. 7 is a partial cross-sectional view taken along line A-A in FIG. 5.

When the stepping motor 78 rotates the winding drum 80 clockwise (from the top to the bottom in FIG. 4) and winds in the right portion of the traction wire 82 (in FIG. 4 or 5), the moving base plate 74 and the paste coater 20 mounted on the moving base plate 74 move to the right (while referring to FIG. 4 or 5). On the other hand, when the stepping motor 78 rotates the winding drum 80 counterclockwise (from the bottom to the top in FIG. 4) and winds in the left portion of the traction wire 82 (in FIG. 4 or 5), the moving base plate 74 and the paste coater 20 mounted on the moving base plate 74 move to the left (while referring to FIG. 4 or 5).

The end detection unit includes: optical sensors 88R and 88L, such as photointerrupters, and a light blocking plate 90 to be inserted into or removed from the gap between the optical sensors 88R and 88L. The optical sensors 88R and 88L are secured to the respective ends of a sensor mounting fixture 92 provided upright on the fixed base plate 70. The light blocking plate 90 is integrally formed with a motor mounting fixture 94 to attach a motor 44.

When the moving base plate 74 has moved to the left end (in FIG. 4 or 5), the light blocking plate 90 enters the gap of the optical sensor 88L and blocks light, and the optical sensor 88L detects that the moving base plate 78 detects that the moving base plate 74 has reached the left end. On the other hand, when the moving base plate 74 has moved to the right end (in FIG. 4 or 5), the light blocking plate 90 enters the gap of the optical sensor 88R and blocks light, and the optical sensor 88R detects that the moving base plate 84 detects that the moving base plate 74 has reached the right end.

Figure 8:
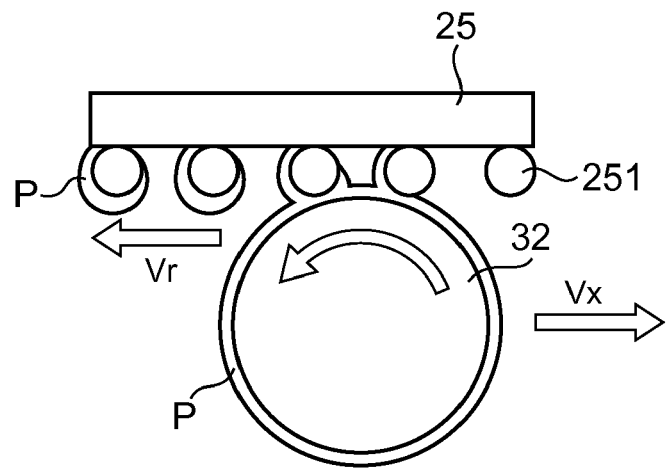
FIG. 8 is an enlarged diagram showing the transfer roller of the paste coater in FIG. 7 during the application of paste, and a semiconductor package.

When the suction nozzle 15 holds the semiconductor package 25 at a predetermined position above the paste coater 20, the controller 24 permits the roller drive mechanism 34 and the slide mechanism 29 to rotate the transfer roller 32 and move the paste coater 20. At this time, as shown in FIG. 8, the tangential velocity Vr at the surface of the transfer roller 32 is lower than the movement velocity Vx of the sub frame 30 (i.e., the transfer roller 32).

In this embodiment, the controller 24 controls both the roller drive mechanism 34 and the slide mechanism 29. However, the controller 24 may control only the slide mechanism 29 while the transfer roller 32 continues to rotate at a constant speed, or may control only the roller drive mechanism 34 while the paste coater 20 continues to move at a constant speed.

Since the tangential velocity Vr of the transfer roller 32 is not equal, but is slightly lower than the movement speed Vx of the transfer roller 32, a solder paste P can be applied to ball electrodes 251 by shearing motion between transfer roller and bump electrodes, and a considerably large amount of the solder paste P can be retained downstream and be used for application to the ball electrodes 251.

It is preferable that the diameter of the transfer roller 32 be about 2 to 20 times the pitch of the ball diameter 251. In this case, several of the arrays (specifically, about three to eight arrays) of the ball electrodes 251 are dipped in the solder paste P attached to the transfer roller 32. The preferable film thickness of the solder paste P on the transfer roller 32 is about 0.2 mm. For precise adjustment of this film thickness, a user need only manually turn the adjustment screw 66 and change the gap between the surface of the transfer roller 32 and the distal edge of the squeegee 38.

Furthermore, for the adjustment of the amount of the solder paste P to be applied to the ball electrodes 251, the user need only change the velocity differential between the tangential velocity Vr of the transfer roller 32 and the movement velocity Vx of the transfer roller 32, or control the height of the suction nozzle 15 (i.e., the depth of dipping the ball electrodes 251). Specifically, bridges will not occur by dipping up to two thirds of the depth of the ball electrodes 251.

A change in the amount of coating is also adjustable by optimizing an application condition as the velocity Vr≈Vx is changed within a range of 10 to 100 mm/second in accordance with physical property differences, such as the viscosity of a solder paste, thixotropic ratio, a mixture ratio of a solder ball to a flux element and a mixture ratio of solder balls having different particle sizes. As synergism, the attachment of a solder paste to the surface of a board and the formation of a bridge are prevented. Generally, as the velocity increases, the bridge prevention effects become greater.

When the pitch of the ball electrodes 251 is near the diameter of the transfer roller 32, the transfer roller 32 would fit between two adjacent arrays of the ball electrodes 251. To avoid this, the semiconductor package 25 may be moved so as to position the arrays of the ball electrodes 251 obliquely, relative to the transfer roller 32.

A flexible material, such as sponge, may be used for the surface of the transfer roller 32 to absorb the height difference of the ball electrodes 251 and to stably apply an appropriate amount of solder paste.

Instead of moving the paste coater 20 in the above embodiment, the suction nozzle 15 (i.e., the semiconductor package 25) may be moved. In this case, the nozzle conveying mechanism 18 moves the suction nozzle 15 perpendicular to the rotary shaft of the transfer roller 32. The controller 24 controls the roller drive mechanism 34 and the nozzle conveying mechanism 18 so as to set the tangential velocity Vr at the surface of the transfer roller 32 lower than the movement velocity Vx of the suction nozzle 15. In this example, the controller 24 controls both the roller drive mechanism 34 and the nozzle conveying mechanism 18; however, as previously described, the controller 24 may control either one of them.

Both the paste coater 20 and the suction nozzle 15 may be moved. The controller 24 controls the roller drive mechanism 34, the slide mechanism 29 and the nozzle conveying mechanism 18. In short, the controller need only set the movement velocity Vx of the transfer roller 32, relative to the semiconductor package 25, higher than the tangential velocity Vr of the transfer roller 32.

In the above embodiment, the squeegee 38 and the paste storage unit 36 each include two members. However, a squeegee and a storage unit may be integrally provided by forming, in the squeegee, a recessed portion that serves as a storage unit.

The embodiment of the present invention has been described. However, this embodiment is merely an example for carrying out the present invention, and the present invention is not limited to this embodiment and can be provided by variously modifying the embodiment without departing from the subject of the invention.

The invention claimed is:

1. A paste coater for applying solder paste to arrays of bump electrodes that project outward from a semiconductor package, comprising:
   a sub frame;
   a transfer roller rotatably and horizontally supported at said sub frame;
   a roller drive mechanism for rotating said transfer roller;
   a paste storage unit for storing paste to be supplied to the surface of said transfer roller;
   a squeegee having a distal edge parallel to a rotary shaft of said transfer roller, and being located with a gap between the surface of said transfer roller and the distal edge;
   a squeegee holder comprising a leaf spring that has one end fixed to said sub frame and the other end oscillatable, and that is folded so as to have a U-shaped cross section and a movable piece whose cross section is L-shaped, and where the squeegee is mounted at one end and the other end is secured to the other end of the leaf spring and it forms a cantilever using the leaf spring as a supporting point; and supporting said squeegee while urging said squeegee in one of either a direction to extend the gap or a direction to reduce the gap;
   a gap adjustment mechanism comprising a screw fitted to said sub frame and an elevating member projecting from a head of the screw and contacting said movable piece, and impelling said squeegee to the direction to narrow the gap down;

a slide mechanism to move said sub frame to a perpendicular direction with regard to the rotary shaft of said transfer roller; and a controller for controlling at least one of said roller drive mechanism and said slide mechanism, so that a tangential velocity at the surface of said transfer roller is lower than a movement velocity of said sub frame.

2. The paste coater according to claim 1, wherein said squeegee is supported to direct a distal edge to a lower half surface of said transfer roller, and said paste storage unit is placed on said squeegee.

3. The paste coater according to claim 1, wherein said controller operates by increasing/decreasing the difference between the tangential velocity at the surface of said transfer roller and the movement velocity of the sub frame.

4. A package on package automatic mounting apparatus, which mounts a second semiconductor package supplied with bump electrodes on a first semiconductor package, comprising:

a first tray on which a plurality of first semiconductor packages are arranged;

a second tray on which a plurality of second semiconductor packages are arranged;

a paste coater for applying solder paste to bump electrodes on the second semiconductor packages; and package conveying means for picking up a first semiconductor package from said first tray and conveying said first semiconductor package to a predetermined position, for picking up a second semiconductor package from said second tray and conveying said second semiconductor package to a paste application position, and for mounting the second semiconductor package on the first semiconductor package at the predetermined position after the solder paste has been applied by said paste coater, wherein the paste coater comprises:

a sub frame;

a transfer roller rotatably and horizontally supported at said sub frame;

a roller drive mechanism for rotating said transfer roller;

a paste storage unit for storing paste to be supplied to the surface of said transfer roller;

a squeegee having a distal edge parallel to a rotary shaft of said transfer roller, and being located with a gap between the surface of said transfer roller and the distal edge; a squeegee holder comprising a leaf spring that has one end fixed to said sub frame and the other end oscillatable, and that is folded so as to have a U-shaped cross section and a movable piece whose cross section is L-shaped, and where the squeegee is mounted at one end and the other end is secured to the other end of the leaf spring and it forms a cantilever using the leaf spring as a supporting point; and supporting said squeegee while urging said squeegee in one of either a direction to extend the gap or a direction to reduce the gap;

a gap adjustment mechanism comprising a screw fitted to said sub frame and an elevating member projecting from a head of the screw and contacting said movable piece, and impelling said squeegee to the direction to narrow the gap down;

a slide mechanism to move said sub frame to a perpendicular direction with regard to the rotary shaft of said transfer roller; and a controller for controlling at least one of said roller drive mechanism and said slide mechanism, so that a tangential velocity at the surface of said transfer roller is lower than a movement velocity of said sub frame.

5. The package on package automatic mounting apparatus according to claim 4, wherein said squeegee is supported to direct a distal edge to a lower half surface of said transfer roller, and said paste storage unit is placed on said squeegee.

6. The package on package automatic mounting apparatus according to claim 4, wherein said controller operates by increasing/decreasing the difference between the tangential velocity at the surface of said transfer roller and the movement velocity of the sub frame.

7. The package on package automatic mounting apparatus according to claim 4, wherein said package conveying means comprises:

a suction nozzle for holding the second semiconductor package using suction; and a nozzle conveying mechanism for moving said suction nozzle perpendicular to the rotary shaft of said transfer roller; and the controller controls at least one of said roller drive mechanism and said slide mechanism, so that a tangential velocity at the surface of said transfer roller is lower than a movement velocity of said sub frame.

8. The package on package automatic mounting apparatus according to one of claims 4, wherein said package conveying means includes:

a first suction nozzle for holding the first semiconductor package using suction;

a first nozzle conveying unit for conveying said first suction nozzle to a predetermined position, and for returning said first suction nozzle to the original position; and a first nozzle positioning unit for restricting movement of said first suction nozzle conveyed to the original position by said first nozzle conveying unit, and for permitting a user to move said first suction nozzle to a desired position.

9. The package on package automatic mounting apparatus according to one of claims 4, wherein said package conveying means includes:

a second suction nozzle for holding the second semiconductor package using suction;

a second nozzle conveying unit for conveying said second suction nozzle to a predetermined position, and for returning said second suction nozzle to the original position; and a second nozzle positioning unit for restricting movement of said second suction nozzle conveyed to the original position by said second nozzle conveying unit, and for permitting a user to move said second suction nozzle to a desired position.

* * * * *